(12) United States Patent
Rao et al.

(10) Patent No.: US 7,969,244 B2
(45) Date of Patent: Jun. 28, 2011

(54) SYSTEM AND METHOD FOR REDUCING FLICKER NOISE FROM CMOS AMPLIFIERS

(75) Inventors: Naresh Kesavan Rao, Clifton Park, NY (US); Richard Gordon Cronce, New Berlin, WI (US); Jianjun Guo, Ballston Spa, NY (US)

(73) Assignee: General Electric Company, Niskayuna, NY (US)

( * ) Notice: Subject to any disclaimer, the term of this patent is extended or adjusted under 35 U.S.C. 154(b) by 157 days.

(21) Appl. No.: 12/173,345

(22) Filed: Jul. 15, 2008

(65) Prior Publication Data

US 2010/0013560 A1    Jan. 21, 2010

(51) Int. Cl.
*H03F 3/04* (2006.01)
(52) U.S. Cl. .................. 330/296; 330/124 R
(58) Field of Classification Search ............ 330/59, 330/124 R, 285, 295, 296, 308
See application file for complete search history.

(56) References Cited

U.S. PATENT DOCUMENTS

| | | | |
|---|---|---|---|
| 6,639,465 B2* | 10/2003 | Samelis et al. | 330/285 |
| 6,661,290 B2* | 12/2003 | Sugiura | 330/295 |
| 7,106,368 B2 | 9/2006 | Daiku et al. | |
| 7,133,075 B2 | 11/2006 | Ishida et al. | |
| 7,339,435 B2* | 3/2008 | Saito | 330/285 |
| 2007/0159253 A1 | 7/2007 | Koh et al. | |

OTHER PUBLICATIONS

European Search Report dated Dec. 3, 2009.
Enz et al., "MICA: A Multichannel Integrated Charge Amplifier for the Read-Out of Multielectrode Detectors", Nuclear Instruments & Methods in Physics Research, A, vol. 332, XP-002556156, pp. 543-553, 1993.
Kishishita et al., "Evaulation of Low-Noise Analog Front-End Application Specific Integrated Circuit for SOlid-State Detectors", Journal of Applied Physics, vol. 47, No. 5, pp. 3423-3427, 2008.

* cited by examiner

*Primary Examiner* — Khanh V Nguyen
(74) *Attorney, Agent, or Firm* — Seema Katragadda

(57) ABSTRACT

A technique is provided for acquiring data with reduced correlated low frequency noise interference via a data acquisition circuit. The data acquisition circuit includes a plurality of data channels comprising a plurality of amplifiers and a biasing circuit for providing bias voltages to the plurality of amplifiers. The biasing circuit is configured to generate the bias voltages and establish a relationship between the bias voltages so as to reduce correlated low frequency noise in the plurality of amplifiers.

17 Claims, 3 Drawing Sheets

SYSTEM AND METHOD FOR REDUCING FLICKER NOISE FROM CMOS AMPLIFIERS

BACKGROUND

The invention relates generally to noise reduction techniques, and more particularly to techniques for reducing correlated low frequency noise in a complementary metal oxide semiconductor (CMOS) amplifier.

Data acquisition circuits are used in a wide range of applications requiring high quality data acquisition and processing. For example, in the field of medical imaging, imaging panels may detect the impinging radiation and convert them into measurable electrical charge through sensors. A data acquisition circuit may then read the electrical charge from the sensors in the imaging panel for subsequent conversion into digital data and image processing.

The first stage of a data acquisition system is typically a low noise amplifier, whose main function is to provide enough gain to overcome the noise of subsequent stages and transform charges into voltage for further processing in some applications. Aside from providing this gain, a LNA should add as little noise as possible and should consume as little power as possible. Additionally, in a multi-channel data acquisition system, the noise contributed by the LNA should not be correlated while power consumption and die size should be minimized. To accomplish this, a single ended amplifier is typically used in every channel instead of the traditional differential amplifier. To further reduce noise, power and area, a common bias circuit is used for all the single ended amplifiers. However, this approach causes any noise in the bias circuit to be correlated across all the channels sharing the bias circuit. Specifically, the correlated low frequency noise such as flicker noise is a nuisance since in the imaging domain, a human eye can average through other broadband noise sources and highlight the offending low frequency noise source. This causes objectionable artifacts in the acquired images.

For example, in systems such as a digital X-ray panel, a large number of sensors (e.g., photodiodes) are multiplexed into a single low noise amplifier (LNA) and reset. When the switch connecting the amplifier to a pixel is opened, it samples the low frequency noise onto the pixel. This is indistinguishable from signals that are generated from an X-ray exposure after the reset. Further, since a large number of photodiodes sampled the low frequency noise, the signal from all the photodiodes have this correlated component that a human eye can easily discern.

Current techniques for minimizing the correlated low frequency noise include use of bipolar CMOS (BiCMOS) or junction field effect transistor (JFET) based amplifiers, differential amplifiers, or a separate bias for each of the channels or amplifiers instead of common bias. However each of these techniques has one or more limitations. For example, BiCMOS or JFET amplifiers are expensive thereby making the detector circuit costly. Alternatively, the use of differential amplifiers increases the power requirement and other noises. Moreover, the use of separate bias circuits per channel increases the power and area requirement and is expensive.

It is therefore desirable to provide cost effective and efficient low noise amplifiers for data acquisition with minimal correlated low frequency noise interference.

BRIEF DESCRIPTION

Briefly, in accordance with one aspect of the technique, a data acquisition circuit is provided. The data acquisition circuit includes a plurality of data channels comprising a plurality of amplifiers and a biasing circuit for providing bias voltages to the plurality of amplifiers. The biasing circuit is configured to generate the bias voltages and establish a relationship between the bias voltages so as to reduce correlated low frequency noise in the plurality of amplifiers.

In accordance with another aspect of the technique, a data acquisition circuit is provided. The data acquisition circuit includes a plurality of data channels comprising a plurality of amplifiers and a biasing circuit for providing a first bias voltage and a second bias voltage to the plurality of amplifiers. The biasing circuit includes a master bias generator for generating the first bias voltage and a bias noise compensator coupled to the master bias generator for generating the second bias voltage proportional to the first bias voltage so as to reduce correlated low frequency noise in the plurality of amplifiers.

In accordance with a further aspect of the technique, a method is provided for acquiring data. The method provides for applying bias voltages to a plurality of amplifiers via a biasing circuit and receiving an input charge from a plurality of sensors via the associated amplifiers. The biasing circuit configured is to generate the bias voltages and establish a relationship between the bias voltages so as to reduce correlated low frequency noise in the plurality of amplifiers.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the present invention are generally directed to correlated low frequency noise reduction techniques in complementary metal oxide semiconductor (CMOS) amplifiers. Such embodiments may be used in a variety of semiconductor devices, such as for bipolar junction transistor (BJT) based devices, field effect transistor (FET) based devices, and so forth. Moreover, such embodiments may be used in a variety of applications, such as for data acquisitions, data reception and/or transmission, data conversion, data storage and so forth. Though the present discussion provides examples in a data acquisition context with respect to CMOS amplifiers, the application of these embodiments in other contexts and in other devices is well within the scope of the present invention.

Figure 1:
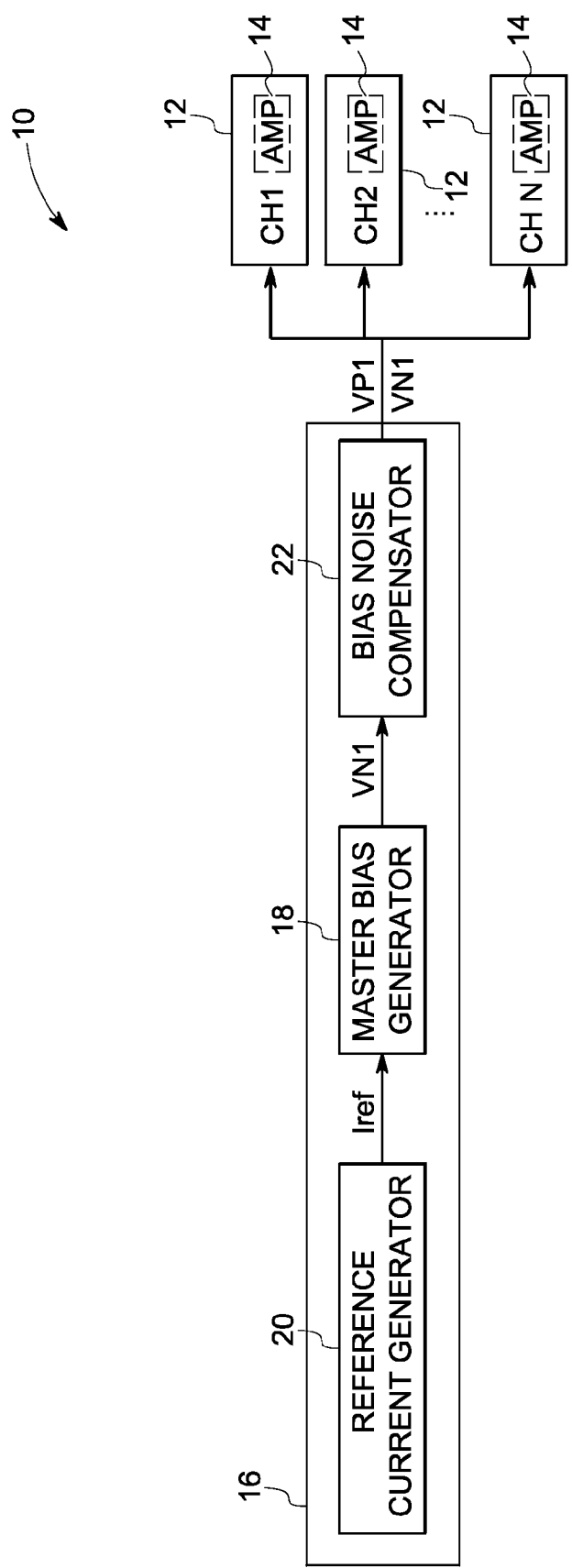
FIG. 1 illustrates a schematic of a data acquisition circuit in accordance with aspects of the present technique.

Referring now to FIG. 1, a schematic of an exemplary data acquisition circuit 10 is illustrated in accordance with aspects of the present technique. The data acquisition circuit 10 includes multiple data channels 12 (channels 1 . . . N) comprising one or more amplifiers 14. In certain embodiments, the amplifiers 14 in each of the plurality of channels 12 may be coupled to the sensors (e.g., photodiodes) in an imaging panel (not shown) for acquiring analog data (e.g., electrical charge) for subsequent conversion into digital data and processing. The data acquisition circuit 10 further includes a biasing circuit 16 for providing bias voltages (e.g., VP1 and VN1) to the plurality of amplifiers 14. In particular, the biasing circuit 16 may be configured to generate the bias voltages and establish a relationship between the bias voltages so as to reduce correlated low frequency noise in the plurality of amplifiers 14 in accordance with aspects of the present technique.

The biasing circuit 16 typically includes a master bias generator 18 for generating initial bias voltages (e.g., Vp and VN1) and a reference current generator 20 for supplying reference current (Iref) to the master bias generator 18. Additionally, the biasing circuit 16 may include a bias noise compensator 22 coupled to the master bias generator 18 for providing the bias-voltages (e.g., VP1 and VN1) based on the initial bias voltages (e.g., VN1), and establishing the relationship between the bias voltages so as to reduce correlated low frequency noise in the plurality of amplifiers 14, in accordance with aspects of the present technique. In certain embodiments, the data acquisition circuit 12 may also include a tuning circuit (not shown) for optimizing the performance of the biasing circuit 16. In particular, the tuning circuit may tune the reference current generator 20 and the bias noise compensator 22 for an optimal performance as will be described in greater detail below.

Figure 2:
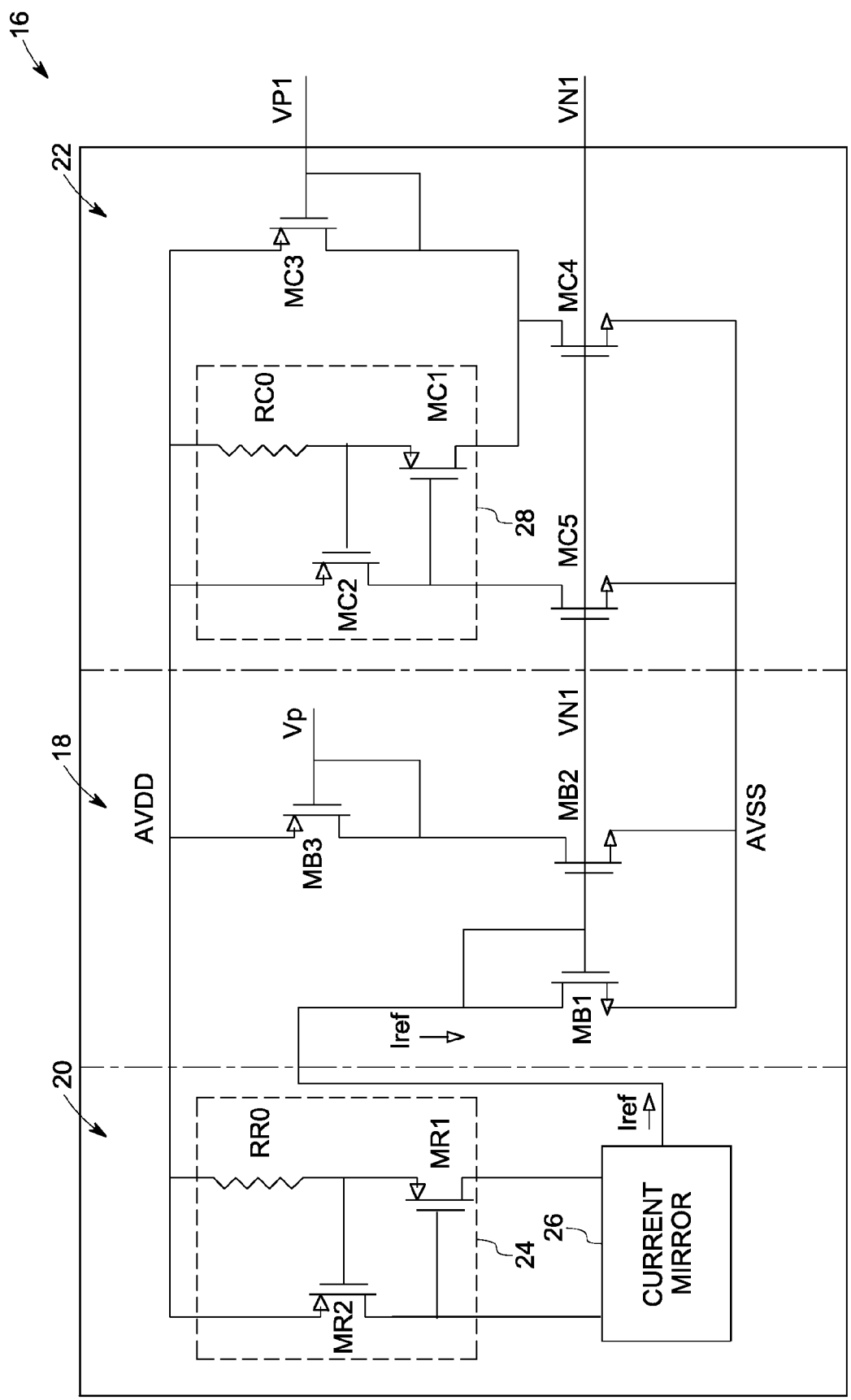
FIG. 2 illustrates the biasing circuit of FIG. 1 in greater detail and in accordance with aspects of the present technique.

The biasing circuit 16 shown in FIG. 1 is illustrated in greater detail in FIG. 2. In FIG. 2, the reference current generator 20 includes a current source 24 and a current mirror structure 26. In certain embodiments, the current source 24 may be configured from a resistor RR0 and PMOS devices MR1 and MR2. The resistor RR0 and the PMOS device MR2 may be connected to positive voltage supply AVDD. The current mirror structure 26 replicates the current from the current source 24 and supplies reference current Iref to the master bias generator 18. As noted above, the master bias generator 18 generates initial bias voltages Vp and VN1 based on the reference current Iref. In the illustrated embodiment, the master bias generator 18 includes a plurality of CMOS devices MB1, MB2 and MB3. MB1 and MB2 are NMOS devices coupled to the negative voltage supply AVSS while MB3 is a PMOS device coupled to the positive voltage supply AVDD. MB1 and MB2 form an NMOS current mirror to generate VN1. The output of MB2 is connected to MB3 to generate Vp. It should be noted that FIG. 2 illustrates one configuration for each of the reference current generator 20 and the master bias generator 20. However, other commercially available configurations for reference current generators and master bias generators may instead be employed.

The bias noise compensator 22 is coupled to the master bias generator 18 and typically includes a current source 28 and a plurality of CMOS devices. In certain embodiments, the current source 28 and the plurality of CMOS devices are configured such that noise currents in at least a first set of the plurality of CMOS devices generate bias voltages for at least a second set of the plurality of CMOS devices. This establishes a proportional relationship between the bias voltages of the plurality of CMOS devices, thereby reducing the correlated low frequency noise in the plurality of amplifiers 14.

In the illustrated embodiment, the current source 28 is a low noise current source and is configured from a resistor RC0 and PMOS devices MC1 and MC2. The resistor RR0 and the PMOS device MR2 may be connected to positive voltage supply AVDD. A NMOS device MC5 coupled to the negative voltage supply AVSS serves as a bias for the PMOS device MC2. The bias noise compensator 22 further includes CMOS devices MC3 and MC4. The first CMOS device MC3 is a PMOS device connected to the positive voltage supply AVDD while the second CMOS device MC4 is a NMOS device connected to the negative voltage supply AVSS. The NMOS device MC4 with gate voltage of VN1 and source voltage as AVSS acts as a current sink to the current source 28 and currents from PMOS device MC3. Thus, the bias voltage of MC3 tracks the noise current generated by MC4. This enables the second bias voltage VP1 generated by the first CMOS device MC3 to be generally proportional to the first bias voltage VN1, thereby reducing the correlated low frequency noise in the plurality of amplifiers 14. It should be noted that any noise current in MC4 is acceptable as long as noise current generated by MC3 substantially tracks noise current in MC4. The bias compensator 22 therefore creates the bias voltage VP1 that is generally proportional to the bias voltage VN1. Further, it should be noted that the bias voltage VP1 tracks the bias voltage VN1 and any change in VN1 is substantially tracked by a proportional change in VP1.

As noted above, a tuning circuit may be employed to optimize the performance of the reference current generator 20 and the bias noise compensator 22. This may be achieved by tuning the resistors RR0 and RC0 respectively. The actual value of the resistors RR0 and RC0 typically exhibits a relative large variation due to process and temperature drift. Consequently, the absolute value of the current generated by the current sources 24 and 28 may vary from chip to chip and from time to time. The tuning circuit therefore adjusts the currents from the current sources 24 and 28 by comparing them against a current source that is more accurate and less sensitive to process and temperature variation.

Figure 3:
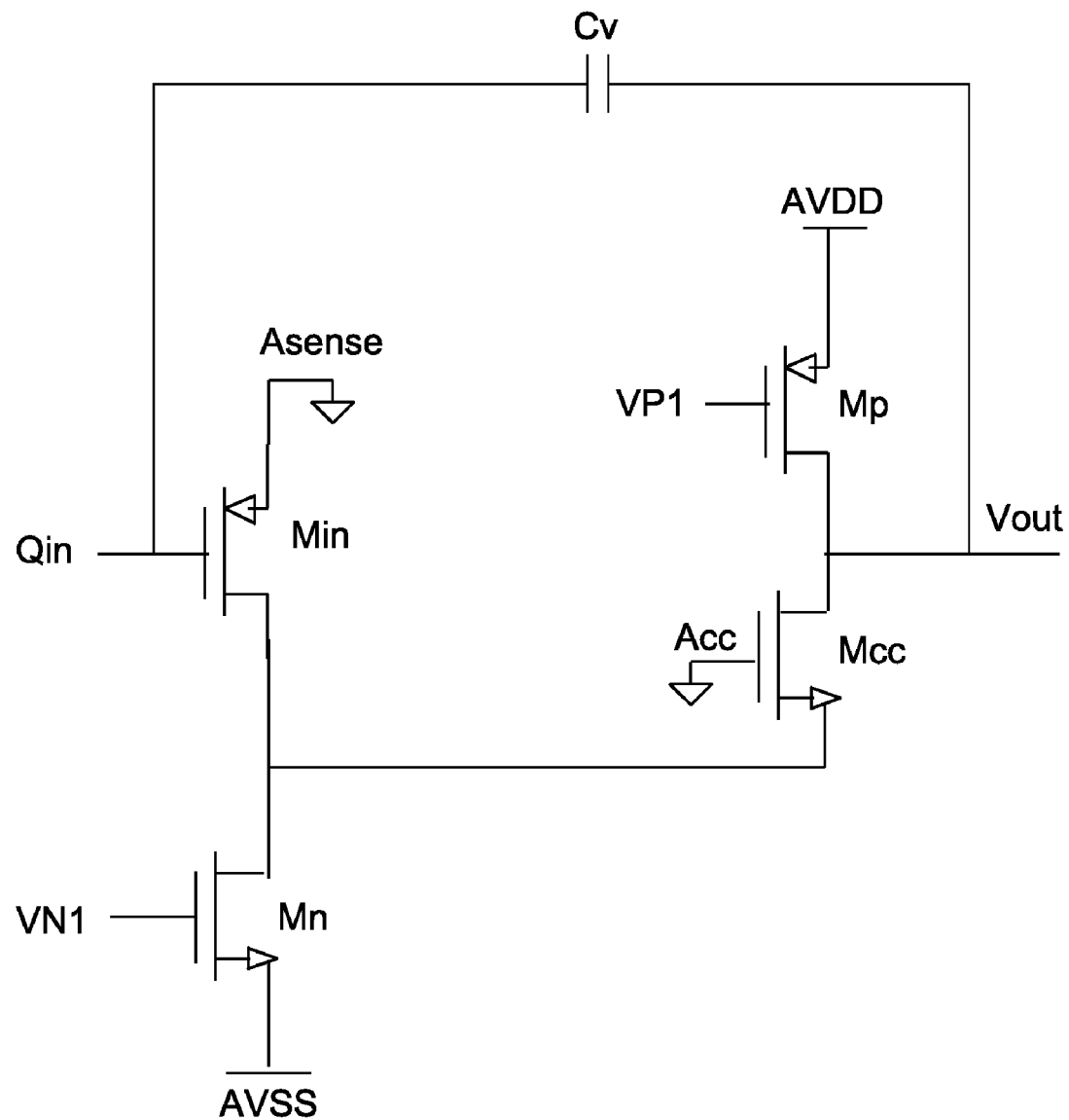
FIG. 3 illustrates the amplifier of FIG. 1 in greater detail and in accordance with aspects of the present technique.

The amplifier 14 shown in FIG. 1 is illustrated in greater detail in FIG. 3. In certain embodiments, the amplifier 14 may be an integrator amplifier. Further, in certain embodiments, the amplifier may be CMOS based low noise amplifier. The CMOS based low noise amplifier comprises a primary CMOS device for receiving an input charge from a sensor (e.g., photodiode in an imaging panel) and a plurality of secondary CMOS devices for receiving bias voltages from the biasing circuit 16 and maintaining a substantially constant voltage across the first CMOS device in accordance with aspects of the present technique. It should be noted that noise currents in the plurality of secondary CMOS devices should be substantially equal and balance each other for maintaining a substantially constant voltage across the first CMOS device. This is made possible by the biasing circuit 16 by way of establishing proportional bias voltages.

For example, in the illustrated embodiment, the amplifier 14 is a CMOS based low noise integrator amplifier configured to read input charge Qin from the sensor. The CMOS based low noise integrator amplifier includes a first CMOS device Min for receiving an input charge Qin from the sensor (not shown). Min is a PMOS device connected to a reference voltage supply Asense (e.g., ground voltage). The CMOS based low noise amplifier further includes a second CMOS device Mp and a third CMOS device Mn. The second CMOS device Mp is a PMOS device connected to the positive voltage supply AVDD while the third CMOS device Mn is a NMOS device connected to the negative voltage supply AVSS. The second CMOS device Mp and the third CMOS device Mn receive the second bias voltage VP1 and the first bias voltage VN1 respectively from the bias noise compensator 22. The CMOS based low noise amplifier further comprises a cascode device Mcc for isolating the second CMOS device Mp and the third CMOS device Mn. The cascode device Mcc may be a NMOS device having a separate bias Ace. The output voltage Vout may be generated via an output capacitor Cv connected across the gate of first CMOS device Min and the drain of the second CMOS device Mp. The output voltage Vout is given via equation Vout=Qin/Cv.

It should be noted that any correlated noise current in the second CMOS device Mp will create a proportional noise current in the third CMOS device Mn and vice versa. Typically, the charge Qin on device Min would have changed to eliminate the difference between the two noise currents, thereby causing correlated low frequency noise such as flicker noise. Thus, in order to reduce, minimize, otherwise eliminate the correlated low frequency noise, it is desirable that the charge Qin not change and any noise current in the second and the third CMOS devices compensate each other.

In accordance with the aspects of the present technique, the noise current in Mn caused by the bias VN1 is substantially cancelled by the noise current in Mp caused by the bias VP1, thereby leaving the Qin node unperturbed. In other words, any correlated noise current in the second CMOS device Mp will create substantially equal noise current in the third CMOS device Mn and vice versa since the bias voltage VP1 is proportional to the bias voltage VN1. The two equal noise currents in the second and the third CMOS device Mp and Mn will balance each other, thereby maintaining a substantially constant voltage across the first CMOS device Min and reducing, minimizing or otherwise eliminating the correlated low frequency noise from the amplifier.

The correlated low frequency noise (e.g., flicker noise) reduction techniques described in the embodiments discussed above provide cost-effective and power efficient data acquisition with reduced or no correlated low frequency noise. The use of low cost, conventional CMOS devices in the biasing circuit and the low noise amplifiers reduces the cost while the use of common biasing reduces the power and area requirement, thereby making the data acquisition circuit compact, power efficient and cost effective. Moreover, the noise reduction techniques enable the data acquisition circuit to achieve the better or equal noise performance as that of more expensive BiCMOS or JFET based low noise amplifiers, power intensive differential low noise amplifiers, or power and area intensive multiple biasing techniques.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A data acquisition circuit, comprising:
a plurality of data channels comprising a plurality of amplifiers;
a biasing circuit for providing bias voltages to the plurality of amplifiers, the biasing circuit including a bias noise compensator and configured to generate the bias voltages and establish a relationship between the bias voltages so as to reduce correlated low frequency noise in the plurality of amplifiers; and
a tuning circuit for optimizing the biasing circuit.

2. The data acquisition circuit of claim 1, wherein the biasing circuit comprises a master bias generator for generating initial bias voltages.

3. The data acquisition circuit of claim 2, wherein the biasing circuit further comprises a reference current generator for supplying reference current to the master bias generator.

4. The data acquisition circuit of claim 1, wherein each of the plurality of amplifiers comprises a CMOS based low noise amplifier.

5. The data acquisition circuit of claim 4, wherein the CMOS based low noise amplifier comprises a primary CMOS device for receiving an input charge and a plurality of secondary CMOS devices for receiving bias voltages from the biasing circuit and maintaining a substantially constant voltage across the primary CMOS device.

6. The data acquisition circuit of claim 5, wherein noise currents in the plurality of secondary CMOS devices are substantially equal and balanced.

7. The data acquisition circuit of claim 1, wherein the bias noise compensator comprises a low noise current source and a plurality of CMOS devices such that noise currents in at least a first set of the plurality of CMOS devices generate bias voltages for at least a second set of the plurality of CMOS devices.

8. The data acquisition circuit of claim 1, wherein the bias noise compensator reduces the correlated low frequency noise in the plurality of amplifiers by establishing a proportional relationship between the bias voltages.

9. A data acquisition circuit, comprising:
a plurality of data channels comprising a plurality of amplifiers;
a biasing circuit for providing a first bias voltage and a second bias voltage to the plurality of amplifiers, the biasing circuit comprising a master bias generator for generating the first bias voltage and a bias noise compensator coupled to the master bias generator for generating the second bias voltage proportional to the first bias voltage so as to reduce correlated low frequency noise in the plurality of amplifiers; and
a tuning circuit for optimizing the biasing circuit.

10. The data acquisition circuit of claim 9, wherein the amplifier comprises a CMOS based low noise amplifier comprising a first CMOS device for receiving an input charge and a second and a third CMOS device for receiving the first bias voltage and the second bias voltage respectively from the bias noise compensator and maintaining a substantially constant voltage across the first CMOS device.

11. The data acquisition circuit of claim 10, wherein noise currents in the second and the third CMOS device are substantially equal and balanced.

12. The data acquisition circuit of claim 9, wherein the bias noise compensator enables the second bias voltage to track the first bias voltage.

13. The data acquisition circuit of claim 9, wherein the bias noise compensator comprises a low noise current source and a first and a second CMOS device such that bias voltage of the first CMOS device tracks the noise current generated by the second CMOS device.

14. A method for acquiring data, the method comprising:
generating a first bias voltage via a master bias generator;
generating a second bias voltage proportional to the first bias voltage via a bias noise compensator coupled to the master bias generator in a biasing circuit;
providing the first bias voltage and the second bias voltage to a plurality of amplifiers so as to reduce correlated low frequency noise in the plurality of amplifiers; and
optimizing the biasing circuit via a tuning circuit.

15. The method of claim 14, further comprising supplying reference current to the master bias generator via a reference current generator.

16. The method of claim 14, wherein noise currents in a plurality of secondary CMOS devices in the plurality of amplifiers, are substantially equal and balanced.

17. The method of claim 14, wherein the bias noise compensator comprises a low noise current source and a plurality of CMOS devices such that noise currents in at least a first set of the plurality of CMOS devices generate bias voltages for at least a second set of the plurality of CMOS devices.

* * * * *